(12) United States Patent
Xu (10) Patent No.: US 7,541,958 B2
(45) Date of Patent: Jun. 2, 2009

(54) ERROR REDUCTION FOR PARALLEL, TIME-INTERLEAVED ANALOG-TO-DIGITAL CONVERTER

(75) Inventor: Fang Xu, Newton, MA (US)

(73) Assignee: Teradyne, Inc., North Reading, MA (US)

( * ) Notice: Subject to any disclaimer, the term of this patent is extended or adjusted under 35 U.S.C. 154(b) by 32 days.

(21) Appl. No.: 11/618,792

(22) Filed: Dec. 30, 2006

(65) Prior Publication Data
US 2008/0169949 A1  Jul. 17, 2008

(51) Int. Cl.
*H03M 1/12* (2006.01)

(52) U.S. Cl. .................. 341/155; 341/117; 341/118; 341/119; 341/120

(58) Field of Classification Search .............. 341/119, 341/120, 155, 117, 118
See application file for complete search history.

(56) References Cited

U.S. PATENT DOCUMENTS

| | | | |
|---|---|---|---|
| 4,547,862 A | | 10/1985 | McIver et al. |
| 4,763,105 A | * | 8/1988 | Jenq ............................ 341/120 |
| 6,384,756 B1 | * | 5/2002 | Tajiri et al. ................... 341/120 |
| 6,522,282 B1 | * | 2/2003 | Elbornsson ................ 341/155 |
| 6,700,515 B2 | * | 3/2004 | Asami ......................... 341/120 |
| 6,801,145 B2 | * | 10/2004 | Asami ......................... 341/118 |
| 6,809,668 B2 | * | 10/2004 | Asami ......................... 341/120 |
| 7,049,984 B2 | * | 5/2006 | Wood et al. .................. 341/120 |
| 7,084,793 B2 | * | 8/2006 | Elbornsson ................ 341/118 |
| 7,183,953 B2 | | 2/2007 | Kadota |
| 2004/0008135 A1 | | 1/2004 | Asami |
| 2006/0061501 A1 | | 3/2006 | Sheng |
| 2006/0227026 A1 | | 10/2006 | Kadota |
| 2006/0232460 A1 | | 10/2006 | Huang |
| 2006/0267813 A1 | | 11/2006 | Asami |

FOREIGN PATENT DOCUMENTS

EP          1720259 A       11/2006

OTHER PUBLICATIONS

U.S. Appl. No. 11/540,773, Fang Xu.
W.C. Black Jr. and D.A. Hodges, "Time Interleaved Converter Arrays", IEEE International Conference on Solid State Circuits, Feb. 1980, pp. 14-15.
W.C. Black Jr. and D.A. Hodges, "Time Interleaved Converter Arrays", IEEE Journal of Solid State Circuits, Dec. 1980, vol. 15, pp. 1022-1029.
N. Kurosawa, et al., "Explicit Analysis of Channel Mismatch Effects in Time Interleaved ADC Systems," IEEE Trans. Circuits and Systems I, vol. 48, No. 3, Mar. 2003.
K.Poulton,et al.,"A 20GS/s 8-b ADC with a 1MB Memory in 0.18 μm CMOS," IEEE International Conference on Solid State Circuits, Feb. 2003, pp. 318-319,496.

(Continued)

*Primary Examiner*—Jean B Jeanglaude
(74) *Attorney, Agent, or Firm*—Bruce D. Rubenstein (57) ABSTRACT

A technique for reducing errors in a PTIC (parallel, time-interleaved analog-to-digital converter) consisting of M ADCs involves sampling an input signal with the PTIC and performing M different DFTs, one for each ADC. Elements of the M DFTs are grouped together according to frequency and multiplied by correction matrices to yield a corrected, reconstructed power spectrum for the PTIC. The technique is especially effective at removing gain and phase errors introduced by individual ADCs of the PTIC, including gain and phase errors that vary with frequency.

32 Claims, 7 Drawing Sheets

OTHER PUBLICATIONS

S. Velazquez, "High-performance advanced filter bank analog-to-digital converter for universal RF receivers", IEEE SP International Symposium on Time-Frequency and Time-Scale Analysis, 1998, pp. 229-232.

Y.-C. Jeng, "Perfect reconstruction of digital spectrum from nonuniformly sampled signals," IEEE Trans. Instrum. Meas., vol. 46, Issue 3, Jun. 1997, pp. 649-652.

Koji Asami, "Technique to Improve the Performance of Time-Interleaved A-D converters", International Test conference, Nov. 2005.

Douglas L. Jones, "Decimation-in-time (DIT) Radix-2 FFT," Aug. 15, 2006, http://cnx.org/content/m12016/latest/.

Douglas L. Jones, "Radix-4 FFT Algorithms," Aug. 18, 2006, http://cnx.org/content/m12027/latest/.

European Patent Office (ISA), "Notification of Transmittal of the International Search Report and the Written Opinion of the International Searching Authority, or the Declaration," including ISR and Written Opinion of the ISA, Apr. 15, 2008.

\* cited by examiner

ERROR REDUCTION FOR PARALLEL, TIME-INTERLEAVED ANALOG-TO-DIGITAL CONVERTER

CROSS-REFERENCES TO RELATED APPLICATIONS

Not Applicable.

STATEMENT REGARDING FEDERALLY SPONSORED RESEARCH OR DEVELOPMENT

Not Applicable.

NAMES OF PARTIES TO A JOINT RESEARCH AGREEMENT

Not Applicable

REFERENCE TO A "SEQUENCE LISTING," A TABLE, OR A COMPUTER PROGRAM LISTING APPENDIX

Not Applicable.

BACKGROUND OF THE INVENTION

1. Field of the Invention

This invention relates generally to techniques for converting analog signals into digital signals, and, more particularly, to techniques for correcting errors in sampled data acquired from parallel, time-interleaved analog-to-digital converters.

2. Description of Related Art

In many applications, a need arises for converting analog signals into corresponding digital codes. One of these applications is automatic test equipment, or ATE. ATE systems are generally complex electronic systems for verifying the operation of electronic devices or assemblies.

Figure 1:
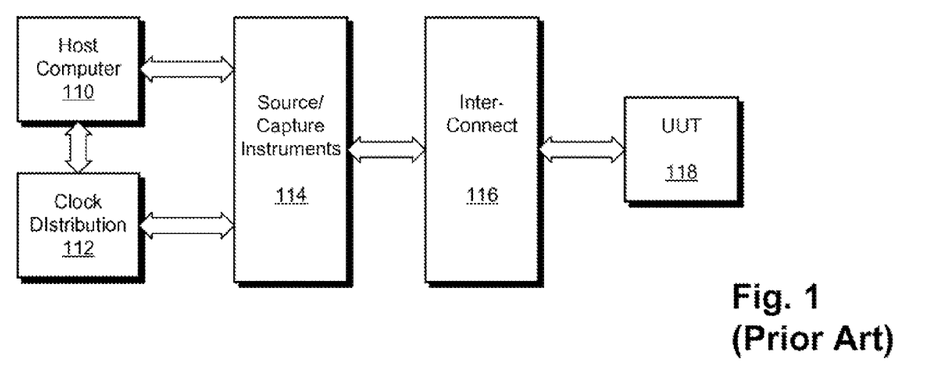
FIG. 1 is a block diagram of Automatic Test Equipment, according to the prior art.

FIG. 1 is a high level block diagram of an ATE system, or "tester." A host computer 110 runs a test program developed for testing a unit under test, or UUT 118. The host computer 110 interactively communicates with a clock distribution circuit 112 and source/capture instruments 114. These instruments provide stimuli to and monitor responses from the UUT 118 via an interconnect 116. Examples of testers are well known in the art, and include the Catalyst™, Tiger™, and Panther™ test systems designed by Teradyne, Inc. of North Reading, Mass.

In ATE as well as other applications, electronic signals are generally converted from analog to digital form through the use of devices called analog-to-digital converters, or ADCs. An ADC is a device that generally has an analog input, for receiving an analog signal to be converted, and a digital output, for providing a converted, digital rendition of the analog signal. Conversions take place at precise instants of time, as defined by a clock signal applied to a clock input of the ADC.

An ADC is generally clocked at a fixed sampling rate, $F_S$. As is known, the maximum frequency that an ADC can unambiguously represent is limited by Shannon's Theory to one-half the sampling rate. This frequency, $F_S/2$, is commonly called the "Nyquist rate."

More generally, ADCs can unambiguously represent analog signals over any maximum bandwidth of $F_S/2$. Outside this bandwidth, a phenomenon called "aliasing" occurs, wherein frequency content outside the band folds back and superimposes within the band. Aliasing is generally regarded as an error, and the analog input signal is typically band limited (filtered) to avoid aliasing.

An important specification of an ADC is its maximum sampling rate—the maximum clock frequency that the device can handle before it fails to operate or errors occur. Because the Nyquist rate is half the sampling rate, the maximum sampling rate directly limits the maximum frequency that an ADC can unambiguously capture.

Figure 2:
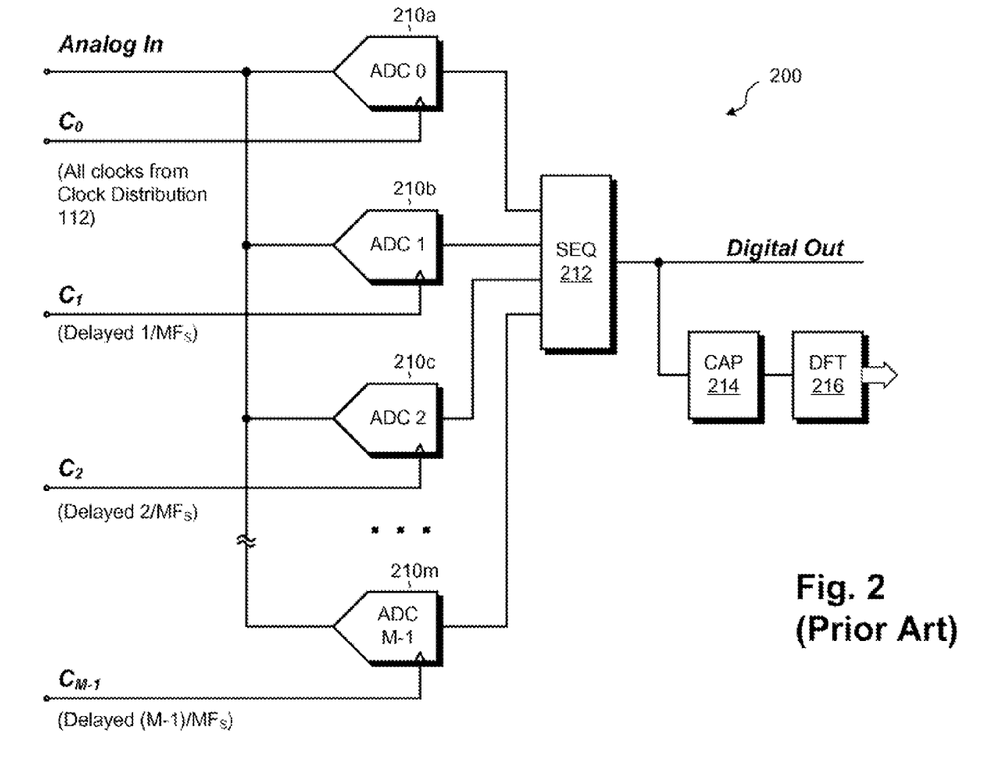
FIG. 2 is a simplified schematic of a parallel, time-interleaved analog-to-digital converter (PTIC), according to the prior art.

To overcome this limitation, designers have developed circuits consisting of many ADCs operated in parallel. An example of this type of circuit, called a parallel, time-interleaved converter, or "PTIC," is shown in FIG. 2. There, M different ADCs 210a-210m have their analog inputs connected together to receive the same input signal, Analog In. A clock generator, such as the clock distribution circuit 112, provides a clock signal to each of the ADCs. The clock signals are operated at the same frequency, $F_S$, but are uniformly spaced in time, such that the delay between successive clocks is approximately $1/MF_S$. A sequencer 212 receives the digital signals from the M ADCs and outputs them, in the order in which they are converted, to produce a combined output signal, Digital Out. Although each ADC operates at a rate of only $F_S$, the circuit as a whole operates at $MF_S$, i.e., a new sample is generated every $1/MF_S$ seconds. The sampling rate, and therefore the Nyquist rate, is effectively increased by a factor of M.

To analyze spectral content of captured signals, the PTIC 200 includes a capture memory 214 and a Discrete Fourier Transform, or "DFT" unit 216. The capture memory 214 holds sequences of sampled signals from Digital Out, and the DFT unit 216 transforms the sampled sequences into power spectra.

This parallel, time-interleaved approach has been used with great success for decades. However, certain obstacles have limited its application. For instance, it is known that different converters are never precisely identical. This is true even when converters are nominally of the same type (e.g., the same manufacturer, model, and grade). Differences between converters cause each of them to convert the analog input signal in slightly different ways. These differences introduce errors in Digital Out. Also, the clock signals feeding the different converters are never exactly aligned with their ideal positions. There is always some timing skew, and this skew introduces additional errors.

Circuit designers have previously developed techniques for correcting errors among the different converters. For instance, developers have prescribed calibration procedures for correcting offset, gain, and phase. For correcting offset errors, offset errors are measured for each converter prior to operation. During operation, samples are individually corrected by subtracting the measured offsets. Gain errors have been addressed in a similar way, by measuring gain errors of each converter and applying them to correct individual samples. Phase errors have also been addressed, by slightly delaying or advancing clock signals to each converter.

Although these techniques have achieved some degree of effectiveness, they are far from optimal. For example, they do not generally account for variations in gain and phase that change with input signal frequency. Therefore, corrections that work for one input frequency often do not work optimally for different input frequencies.

What is needed is a way of correcting for errors among converters in parallel, interleaved topologies, which accounts for the frequency dependency of gain and phase.

BRIEF SUMMARY OF THE INVENTION

In accordance with one embodiment of the invention, a method of testing signals with a PTIC (parallel, time-interleaved converter) includes stimulating a UUT (unit under test) to produce an SUT (signal under test), which has at least one test requirement, and applying the SUT to a PTIC. The PTIC includes M ADCs (analog-to-digital converters) each clocked at a rate $F_S$ and time-interleaved to provide an overall sampling rate of $MF_S$. The method further includes acquiring a series of samples of the SUT by each of the M ADC's of the PTIC. A DFT (Discrete Fourier Transform) is performed on each series of samples to yield M DFTs. The M DFTs are processed to yield a reconstructed spectrum covering a frequency range greater than $F_S$. The reconstructed spectrum is analyzed to determine whether the UUT meets the at least one test requirement, and the UUT is discarded or graded depending on the test result.

In accordance with another embodiment, a method of transmitting and receiving a signal includes applying a signal to a PTIC (parallel, time-interleaved converter) that includes M ADCs (analog-to-digital converters) each clocked at a rate $F_S$ and time-interleaved to provide an overall sampling rate of $MF_S$. A series of samples are acquired of the signal by each of the M ADCs of the PTIC, and a DFT (Discrete Fourier Transform) is performed on each series of samples to yield M DFTs. The method further includes processing the M DFTs to yield a reconstructed spectrum covering a frequency range greater than $F_S$, transmitting the reconstructed spectrum to a receiving circuit, and performing and inverse DFT on the received, reconstructed spectrum to reconstruct the signal.

In accordance with yet another embodiment, a circuit for analyzing a signal includes an input and a clock generator for generating M clocks each operable at a rate $F_S$ and each having a different phase. The circuit further includes M ADCs, each having an analog input coupled to the input, a digital output, and a clock input coupled to the clock generator for receiving a respective one of the M clocks. M DFT units are respectively coupled to the digital outputs of the M ADCs and are constructed and arranged for producing DFT elements. The circuit also includes a processor, coupled to the M DFT units and having encoded instructions for processing the DFT elements from the M DFT units, to produce a reconstructed spectrum covering a frequency range greater than $F_S$.

According to yet another embodiment, a circuit for analyzing a signal includes an input and a clock generator for generating a plurality of clocks each operable at a rate $F_S$. Each clock has a different phase. The circuit further includes a plurality of ADCs, each having an analog input coupled to the input, a digital output, and a clock input coupled to the clock generator for receiving a respective one of the plurality of clocks. DFT means are coupled to the plurality of ADCs, for calculating DFTs of samples acquired from each of the plurality of ADCs, and processing means are coupled to the DFT means, for processing the DFT elements to construct a reconstructed spectrum covering a frequency range greater than $F_S$.

According to yet a further embodiment, a circuit for analyzing a signal includes an input, a clock generator for generating a plurality of clocks, and a plurality of ADCs. Each of the plurality of ADCs has an analog input coupled to the input, a clock input coupled to the clock generator for receiving a respective one of the plurality of clocks, and a digital output for providing a digital output signal. The circuit further includes a processor for executing encoded instructions. The instructions include instructions for performing a plurality of DFTs on the digital output signal of each of the plurality of ADCs, and inducing encoded instructions for processing and combining the plurality of DFTs to produce a reconstructed spectrum DFT.

BRIEF DESCRIPTION OF THE SEVERAL VIEWS OF THE DRAWINGS

Aspects of the invention disclosed herein may be better understood by reference to the attached drawings, wherein.

DETAILED DESCRIPTION OF THE INVENTION

As used throughout this document, the words "comprising," "including," and "having" are intended to set forth certain items, steps, elements, or aspects of something in an open-ended fashion. Unless a specific statement is made to the contrary, these words indicate an open list to which additional things can be added.

The following definitions are supplied to promote an understanding of the concepts disclosed herein:

PTIC A parallel, time-interleaved converter including M ADCs having analog inputs coupled together and clock inputs receiving clocks of the same frequency but different phase.

M The total number of ADCs in the parallel, time-interleaved converter circuit.

m An index ranging from 1 to M used to identify a particular one of the M ADCs.

N The number of samples acquired by each ADC; alternatively, the number of frequency coefficients of a Discrete Fourier Transform produced from the output of each ADC.

n An index representing a sample acquired from a particular ADC, or from the ADCs operating together; alternatively, an index representing a particular coefficient of a DFT.

FMAF A "Family of Mutually Aliased Frequencies." A set of M frequencies between 0 and $MF_S/2$ that alias to the same frequency when sampled at a rate $F_S$.

i An index used to identity a particular FMAF. Alternatively, an index used to identify a particular sample acquired by an ADC.

x(t) The time varying input signal applied to the ADCs in a PTIC.

$\tilde{x}(t)$ The time varying version of the sampled input signal, including any gain and phase errors.

$\tilde{x}_m(t)$ The time varying version of the input signal sampled by the $m^{th}$ ADC, including gain and phase errors of that ADC.

$\tilde{x}_{m,i}(t)$ A particular sample from a particular ADC, specifically, the $i^{th}$ sample acquired from the $m^{th}$ ADC.

$\tilde{X}_{m,i}$ The frequency domain representation of $\tilde{x}_{m,i}(t)$.

$\hat{x}(t)$ The time varying version of the input signal, corrected for gain and phase errors.

$\hat{X}$ The frequency domain version of the corrected input signal, $\hat{x}(t)$.

τ The actual delay of an ADC s conversion relative to a clock for a first ADC of the PTIC.

For the PTIC of FIG. 1, it was seen that an effective bandwidth of $MF_S/2$ is achieved even though each ADC is operated at only $F_S$. The process of interleaving effectively multiplies the sampling rate. We have recognized, however, that, despite this multiplication, all information about the input signal must be included within the bandwidths of the individual ADCs, i.e., within $F_S/2$. From the perspective of the individual converters of the PTIC, all information about input frequencies above $F_S/2$ is represented as aliased content within the band from DC to $F_S/2$, i.e., the Nyquist band.

Therefore, if a DFT is performed on the series of samples acquired by any of the M converters, each bin "n" of the DFT will include information not only about a frequency $F_n$ within the Nyquist band, but also information about all other frequencies between DC and $MF_S/2$, which alias to bin n. Because aliasing occurs at integer multiples of the sampling rate, plus or minus $F_n$, there are precisely M−1 frequencies outside the Nyquist band that alias to bin n. Said another way, each bin n of the DFT contains information about M different frequencies: the frequency $F_n$ and all frequencies within the band that alias to bin n. Together, these M frequencies form a family of mutually aliased frequencies, or "FMAF."

If information about M different frequencies is found in bin n, then the origin of the frequency content of bin n is ambiguous. One cannot tell whether it comes from $F_n$, from one or more of the aliased frequencies, or from some combination thereof.

A mathematical model has been developed to resolve this ambiguity. The model relies upon the fact that, although M different frequencies contribute to the content of any DFT bin n, there are also M different ADCs from which DFTs may be taken. Therefore, for any bin n, M different equations may be constructed, one for each ADC, wherein each equation has M unknowns. A different set of equations can be constructed for each value of n from 0 to N−1, i.e., for each bin of the DFT. Therefore, the entire spectrum from DC to $MF_S/2$ can be reconstructed from DFTs of the individual converters. As shown herein, the mathematical model also provides a particularly convenient way of correcting for errors in the frequency domain.

We begin by recognizing that any periodic signal can be represented as a series of MN equal spaced values $X_n$ in a bandwidth-limited frequency domain F, with $MF_S=F$. Prior to sampling, the time varying input signal can be defined by an inverse Fourier series:

$$x(t) = \sum_{n=-MN/2}^{MN/2-1} X_n e^{j2\pi \frac{nF}{MN} t}, \quad \text{(EQ. 1)}$$

where MN is the total number of samples. The signal x(t) is real valued, as this is the only form that amplifiers and converters can manipulate. If this continuous time domain waveform is sampled by a converter m, m∈[0,M[ at a sampling frequency $F_S$, or at a sampling interval $T=1/F_S$, we have $$\tilde{x}_m(t) = \sum_{n=-MN/2}^{MN/2-1} \tilde{H}_{m,n} X_n e^{j2\pi \frac{nF_s}{N} t} \quad \text{(EQ. 2)}$$

$\tilde{H}_{m,n}$ has been introduced in EQ. 2 to represent the complex gain of the signal path, including any gain and phase errors, through converter m at frequency $f=nF_S/N$, referenced to the converter's clock. When samples of these M converters are interleaved, we obtain a series of samples in the time domain:

$x_0=\tilde{x}_q(\tau_0),$ $x_1=\tilde{x}_1(\tau_1),\ldots$ $x_M=\tilde{x}_0(\tau+t_0),$ $x_{M+1}=\tilde{x}_1(\tau+t_1),\ldots$ $x_{2M}=\tilde{x}_0(2\tau+t_0),$ $x_{2M+1}=\tilde{x}_1(2\tau+t_1),\ldots \quad \text{(EQ. 3)}$ These represent actual samples acquired from ADCs. The term $x_0$ and the terms that follow on the first line above represent the first sample acquired from each converter (0 to M−1). The term $x_M$ and the terms that follow on the second line represent the second sample acquired from each converter, and $x_{2M}$ and the terms that follow on the third line represent the third sample from each converter.

The quantity $\tau_m$ is defined for m=0 to M−1 and represents a sampling delay of the clock of the $m^{th}$ converter relative to the clock of the first converter (m=0). We notice a special case of $\tau_m=m/MF_S$, wherein samples from all converters are uniformly distributed.

From all of the samples $x_0, x_1, \ldots x_M, x_{M+1}, \ldots, x_{MN-1}$ acquired by the M converters, we can designate the samples from any one converter m as $x_m, x_{m+M}, x_{m+2M}, \ldots x_{m+mM}, \ldots x_{m+M(N-1)}$. Let us denote these samples $$\tilde{x}_{m,i}| \quad \text{(EQ. 4)}$$

where each value of i corresponds to a family of mutually aliased frequencies (FMAF).

An objective of this process is to estimate all corrected frequency components $\hat{X}$ of X. By putting EQ. 4 in the context of EQ. 3, we obtain:

$$\tilde{x}_{m,i} = \tilde{x}_m(iT + \tau_m)|_{i \in [0,N[} \quad \text{(EQ. 5)}$$

Next, by plugging EQ. 5 into EQ. 2 we obtain:

$$= \sum_{n=-MN/2}^{MN/2-1} \tilde{H}_{m,n} \bar{X}_n e^{j2\pi \frac{nF_S}{N}(iT+\tau_m)} \Big|_{i\in[0,N[} \quad (EQ.\ 6)$$

Last, we expand EQ. 6 to obtain:

$$= \sum_{n=-MN/2}^{MN/2-1} \tilde{H}_{m,n} e^{j2\pi \frac{nF_S\tau_m}{N}} \bar{X}_n e^{j2\pi \frac{ni}{N}} \Big|_{i\in[0,N[} \quad (EQ.\ 7)$$

Now, we denote a new term, $$H_{m,n} = \tilde{H}_{m,n} e^{j2\pi f \tau_m}, \quad (EQ.\ 8)$$

as the complex gain of the converter m at frequency $f=nF_S/N$, referenced to a common system clock. $H_{m,n}$ is a useful definition because this quantity can be computed from direct measurements.

We notice that the delay $\tau_m$ of each individual converter is included in EQ. 8 via the expression $e^{j2\pi f \tau_m}$. Substituting EQ. 8 into EQ. 7, we obtain:

$$\tilde{x}_{m,i}\Big|_{i\in[0,N[} = \sum_{n=-MN/2}^{MN/2-1} H_{m,n} \bar{X}_n e^{j2\pi \frac{ni}{N}} \Big|_{i\in[0,N[} \quad (EQ.\ 9)$$

$$= \sum_{k=-M/2}^{M/2-1} \sum_{n=0}^{N-1} H_{m,kN+n} \bar{X}_{kN+n} e^{j2\pi \frac{(kN+n)i}{N}} \Big|_{i\in[0,N[}$$

$$= \sum_{n=0}^{N-1} \left( \sum_{k=-M/2}^{M/2-1} H_{m,kN+n} \bar{X}_{kN+n} \right) e^{j2\pi \frac{ni}{N}} \Big|_{i\in[0,N[}$$

In this last expression, the term $$\sum_{k=-M/2}^{M/2-1} H_{m,kN+n} \bar{X}_{kN+n} \Big|_{n\in[0,N[}$$

represents the weighted alias of signals from the bandwidth of $MF_S$ into the bandwidth $F_S$. The weight is the complex gain of converter m.

We can recognize that the expression above is the inverse Discrete Fourier transform of the weighted alias signal. Now we can apply a Fourier transform on both sides of the equation, to obtain $$\frac{1}{N} \sum_{n=0}^{N-1} \tilde{x}_{m,n} e^{-j2\pi \frac{ni}{N}} \Big|_{i\in[0,N[} = \sum_{k=-M/2}^{M/2-1} H_{m,kN+i} \bar{X}_{kN+i} \Big|_{i\in[0,N[} \quad (EQ.\ 10)$$

or $$\sum_{k=-M/2}^{M/2-1} H_{m,kN+i} \bar{X}_{kN+i} \Big|_{i\in[0,N[} = \tilde{X}_{m,i}, \quad (EQ.\ 11)$$

where $\tilde{X}_{m,i}$ denotes the Discrete Fourier transform of samples captured by converter m. As a result of aliasing, this Fourier transform has N samples instead of MN.

For a given value i, we have M unknowns $$\bar{X}_{kN+i}\Big|_{k\in[0,M-1]}$$

with their coefficients $$H_{m,kN+i}\Big|_{k\in[0,M-1]}$$

We also have one scalar, $$\tilde{X}_{m,i} = \frac{1}{N} \sum_{n=0}^{N-1} x_{m+nM} e^{-j2\pi \frac{ni}{N}}. \quad (EQ.\ 12)$$

As we have M converters, we can get M equations like EQ. 12. If we denote $$\hat{X}_C = \begin{pmatrix} \bar{X}_{-MN/2+i} \\ \cdots \\ \bar{X}_{kN+i} \\ \cdots \\ \bar{X}_{(M/2-1)N+i} \end{pmatrix}, \quad \tilde{X}_C = \begin{pmatrix} \tilde{X}_{0,i} \\ \cdots \\ \tilde{X}_{m,i} \\ \cdots \\ \tilde{X}_{M-1,i} \end{pmatrix}$$

and $$H_C = \begin{pmatrix} H_{0,-MN/2+i} & \cdots & H_{0,kN+i} & \cdots & H_{0,(M/2-1)N+i} \\ \cdots & \cdots & \cdots & \cdots & \cdots \\ H_{m,-MN/2+i} & \cdots & H_{m,kN+i} & \cdots & H_{m,(M/2-1)N+i} \\ \cdots & \cdots & \cdots & \cdots & \cdots \\ H_{M-1,-MN/2+i} & \cdots & H_{M-1,kN+i} & \cdots & H_{M-1,(M/2-1)N+i} \end{pmatrix},$$

then we can write M equations of (EQ. 12) in the form:

$$H_C \hat{X}_C = \tilde{X}_C \quad (EQ.\ 13)$$

As the index i varies from 0 to N−1, we have N linear systems, each comprising M equations of M unknowns, to reconstruct the signal of MN samples in frequency domain.

Since each value of i represents a family of mutually aliased frequencies (FMAF), EQ. 13 provides a complete linear system for each FMAF. Linear systems for different FMAFs are orthogonal from one another, since frequencies from one FMAF cannot alias into other FMAFs.

Each instance of EQ. 13 can be solved for $\hat{X}_C$ by inverting the respective matrix, $H_C$. Both sides of EQ. 13 can then be multiplied by $H_C^{-1}$ to yield $$\hat{X}_C = H_C^{-1} \tilde{X}_C. \quad (EQ.\ 14)$$

Because $\tilde{X}_C$ represents DFT values acquired from individual ADCs and $H_C^{-1}$ can be computed from measured values, EQ. 14 provides a straightforward way to compute a corrected spectrum of a PTIC as a whole from the spectra obtained from individual converters.

Although the principles described hereinabove are sufficient for achieving complete frequency reconstruction, we have recognized that reconstruction can be simplified in most cases by virtue of Hermitian symmetry. Because the input signal and the outputs of the ADCs are all real valued, $H_{m,i}$, $\tilde{X}_1$, and $DFT_i^{-1}(\tilde{x}_{m,n})$ all respect Hermitian symmetry: i.e., $$H_{m,-i}=H_{m,i}^*, \hat{X}_{-i}=\hat{X}_i^n \text{ and}$$

$$DFT_{-1}(\tilde{x}_{m,n})=DFT_{N-1}(\tilde{x}_{m,n})=DFT_1^\alpha(\tilde{x}_{m,n}) \quad \text{(EQ. 15)}$$

Hermitian symmetry requires that, for nearly half of the total equations, where index i varies from N/2+1 to N−1, the solutions to EQ. 14 are redundant. Most implementations of the Fourier Transforms take this symmetry into account, and the "negative" part of the spectrum, which can be obtained from Hermitian symmetry, $$DFT_i(\tilde{x}_{m,n})|_{i\in[N/2,N[}=DFT^*_{N-1}{}^n(\tilde{x}_{m,n})|i\in[o,N/2[ \quad \text{(EQ. 16)}$$

and is neither computed nor saved. Thus, for i≠0 the alias term becomes:

$$\sum_{k=-M/2}^{M/2-3} H_{m,kN+i}\hat{X}_{kN+i}\bigg|_{i\in[1,N/2[} = \left(\sum_{k=0}^{M/2-3} H_{m,kN+i}\hat{X}_{kN+i} + \sum_{k=-M/2}^{-1} H_{m,kN+i}\hat{X}_{kN+i}\right)\bigg|_{i\in[1,N/2[} \quad \text{(EQ. 17)}$$

$$= \left(\sum_{k=0}^{M/2-3} H_{m,kN+i}\hat{X}_{kN+i} + \sum_{k=1}^{M/2} H^*_{m,kN-i}\hat{X}^*_{kN-i}\right)\bigg|_{i\in[1,N/2[}$$

$$= \sum_{k=0}^{M/2-3}\left(H_{m,kN+i}\hat{X}_{kN+i} + H^*_{m,kN+(N-i)}\hat{X}^*_{kN+(N-i)}\right)\bigg|_{i\in[1,N/2[}$$

Therefore, we have:

$$\sum_{k=0}^{M/2-1}\left(H_{m,kN+i}\hat{X}_{kN+i} + H^*_{m,kN+(N-i)}\hat{X}^*_{kN+(N-i)}\right)\bigg|_{i\in]0,N/2[} = \tilde{X}_{m,i} \quad \text{(EQ. 18)}$$

If we now denote $$\hat{X}_R = \begin{pmatrix} \hat{X}^*_{(MN/2)-i} \\ \hat{X}^*_{kN+(N-i)} \\ \hat{X}^*_{N-i} \\ \hat{X}_i \\ \hat{X}_{kN+i} \\ \hat{X}_{(M/2-1)N+i} \end{pmatrix}, \tilde{X}_R = \begin{pmatrix} \tilde{X}_{0,i} \\ \ldots \\ \tilde{X}_{m,i} \\ \ldots \\ \tilde{X}_{M-1,i} \end{pmatrix} \text{ and}$$

then we have $$H_R\hat{X}_R=\tilde{X}_R \quad \text{(EQ. 19)}$$

or $$\hat{X}_R=H_R^{-1}\tilde{X}_R \quad \text{(EQ. 20)}$$

For each value of i, there are still M equations and M unknowns, but the number of values of i and therefore the total number of equations to be solved has been reduced approximately by half.

Because it requires less computation, EQ. 20 is preferred over EQ. 14 for performing spectral reconstruction. However, we have recognized that EQ. 20 cannot readily be used for Nyquist frequencies, i.e., frequencies that occur at integer multiples of $F_S/2$. For these frequencies, EQ. 14 should be used. We also note that, regardless of which equation is used, complete reconstruction of the bandwidth between DC and $MF_S/2$ can be achieved by applying calibration values $H_{m,n}$ obtained from only N/2+1 different, values if FMAFs. This is the case since Hermitian symmetry makes calibration values for the additional N/2−1 FMAFs redundant.

The model set forth hereinabove allows correction to be applied to each bin of a reconstructed spectrum over the full range from DC to $MF_S/2$. Because the terms $H_{m,n}$ account, for both gain and phase, they allow components of the reconstructed spectrum to be individually corrected for gain and phase. And since different values of $H_{m,n}$ are applied for different frequencies, correction is achieved even when gain and phase vary with input signal frequency.

Figure 3:
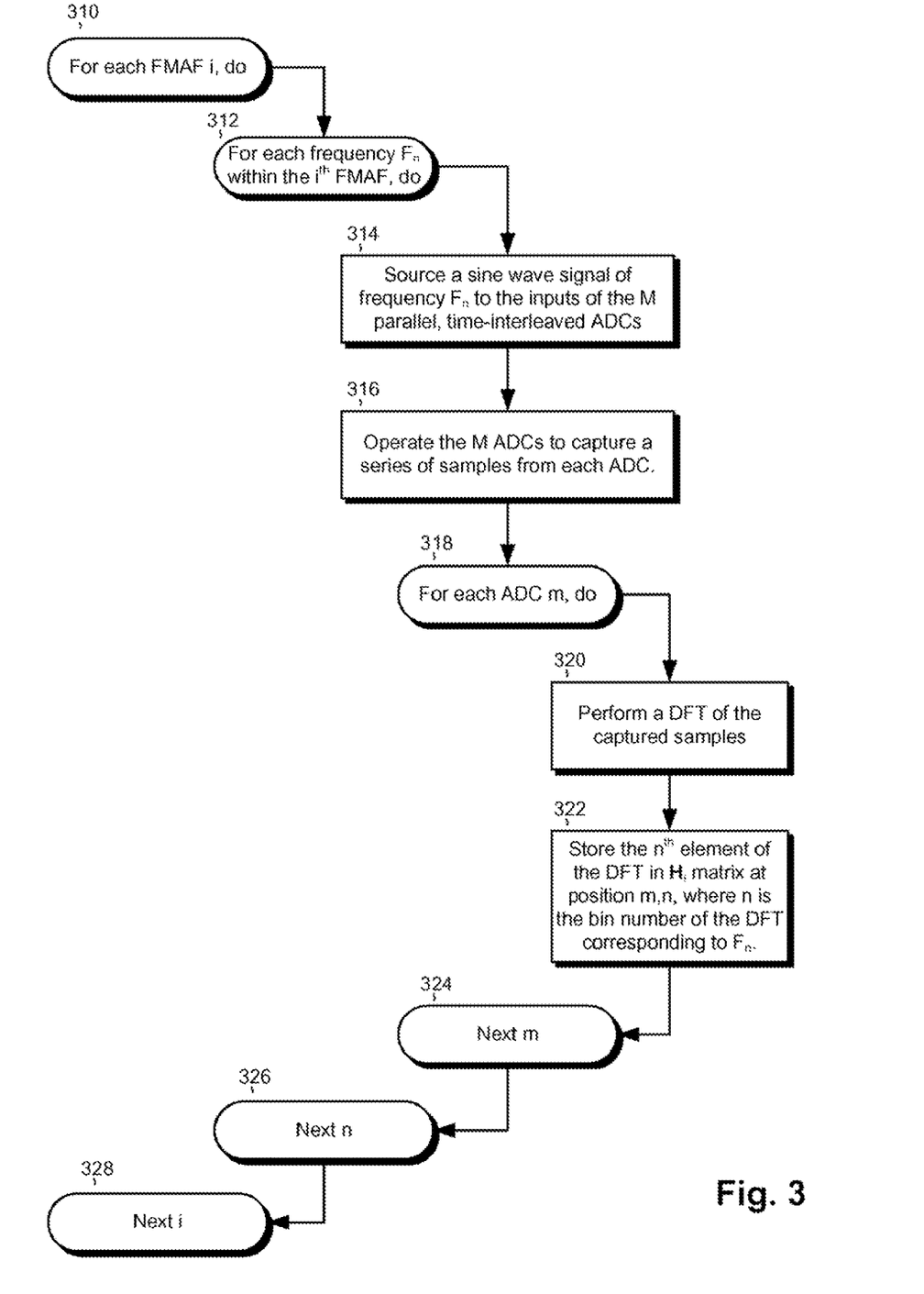
FIG. 3 is a flowchart showing a process according to an embodiment of the invention for acquiring calibration information for a PTIC.

FIG. 3 shows an example of a calibration process for acquiring values for H matrices. This process can be conveniently performed in an ATE system, although it may also be conducted in other contexts.

As stated above, each FMAF includes M frequencies within the range between DC and $MF_S/2$. For each of these M frequencies of a given FMAF, a sine wave having the respective frequency (designated $F_n$) is applied to the PTIC (Step 314). The PTIC is operated and each of its M ADCs is made to capture a series of samples of the sine wave (Step 316). A DFT is performed on each of the resulting M series of samples (Step 320). At step 322, DFT elements are stored in a matrix, $$H_R = \begin{pmatrix} H^*_{0,MN/2-i} & H^*_{0,kN+(N-i)} & H^*_{0,N-i} & H_{0,i} & H_{0,kN+i} & H_{0,(M/2-1)N+i} \\ \ldots & \ldots & \ldots & \ldots & \ldots & \ldots \\ H^*_{m,MN/2-i} & H^*_{m,kN+(N-i)} & H^*_{m,N-i} & H_{m,i} & H_{m,kN+i} & H_{m,(M/2-1)N+i} \\ \ldots & \ldots & \ldots & \ldots & \ldots & \ldots \\ H^*_{M-1,MN/2-i} & H^*_{M-1,kN+(N-i)} & H^*_{M-1,N-i} & H_{M-1,i} & H_{M-1,kN+i} & H_{M-1,(M/2-1)N+i} \end{pmatrix}$$

$H_i$. The term "DFT element" refers to the value reported in a bin of a DFT. One DFT element is stored from each of the M DFTs, making a total of M elements stored per frequency. The stored DFT elements come from corresponding bins of the M DFTs, i.e., from a bin n corresponding to the frequency $F_n$. The DFT elements are stored at positions m,n of the matrix, where m is the index of the ADC and n is the bin number of the DFT element to be stored.

The process is then repeated for each frequency of the FMAF. It is noted that all frequencies of any FMAF are reported in the same DFT bin, i.e., bin n, since they all fall within bin n (either directly or through aliasing). Upon the completion of all frequencies of a FMAF, a correction matrix $H_i$ is completed. The matrix may then be inverted and stored for later use.

Steps 312-326 are repeated for each FMAF. A new matrix $H_i$ is constructed, inverted, and stored for each FMAF. The total number of FMAFs for which this process is conducted depends upon the desired frequency resolution and bandwidth. Preferably, the process is repeated for N/2+1 FMAFs, enough to reconstruct a spectrum covering a bandwidth between DC and $MF_S/2$.

Figure 4:
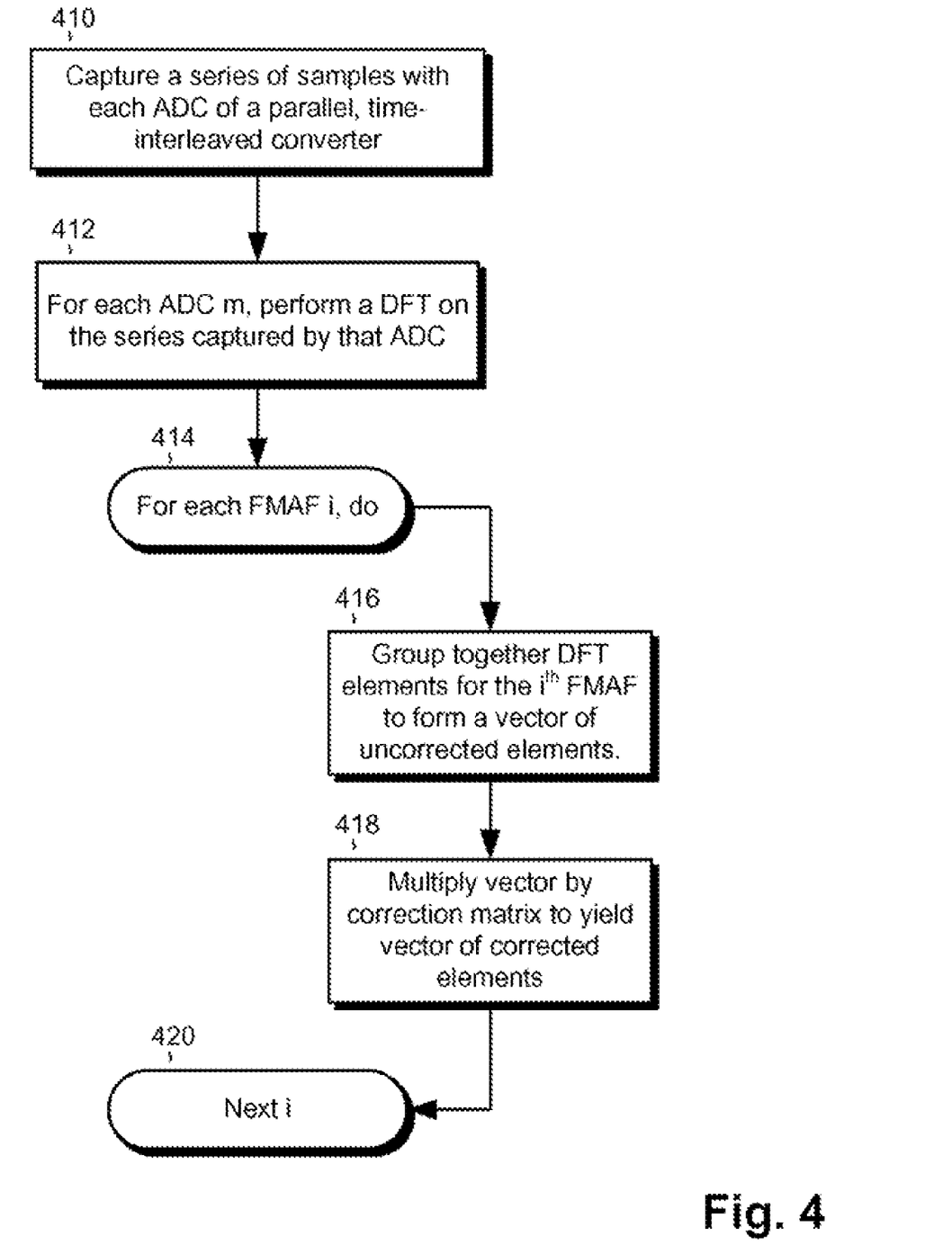
FIG. 4 is a flowchart showing a process according to an embodiment of the invention for applying calibration information to measured input signals.

FIG. 4 shows an example of a process for sampling an input signal with a PTIC and reconstructing the input signal's spectrum. At step 410, each ADC of the PTIC is made to acquire a series of samples of an input signal. At step 412, a DFT is performed on each acquired series. For a PTIC with M different ADCs, M different DFTs are performed.

Next, at step 416, DFT elements for a particular FMAF are grouped together, preferably to form a vector ($\widetilde{X}_C$ or $\widetilde{X}_R$, see EQS. 14 and 20). DFT elements grouped together for any given FMAF all correspond to the same bin number. Therefore, each vector created in step 416 includes M DFT elements, one from the same bin of each of the M DFTs.

At step 418, the vector from step 416 is multiplied by a corresponding matrix, $H_1^{-1}$ (see EQ. 14 and EQ. 20). The matrix $H_i^{-1}$ is simply the inverse of the matrix $H_i$ acquired for the $i^{th}$ FMAF. The product of the M×M matrix with the M×1 vector is an M×1 vector of corrected DFT elements ($\hat{X}_C$ or $\hat{X}_R$). These corrected DFT elements are positioned in the reconstructed spectrum at bin numbers designated in EQS. 13 and 19.

Figure 5:
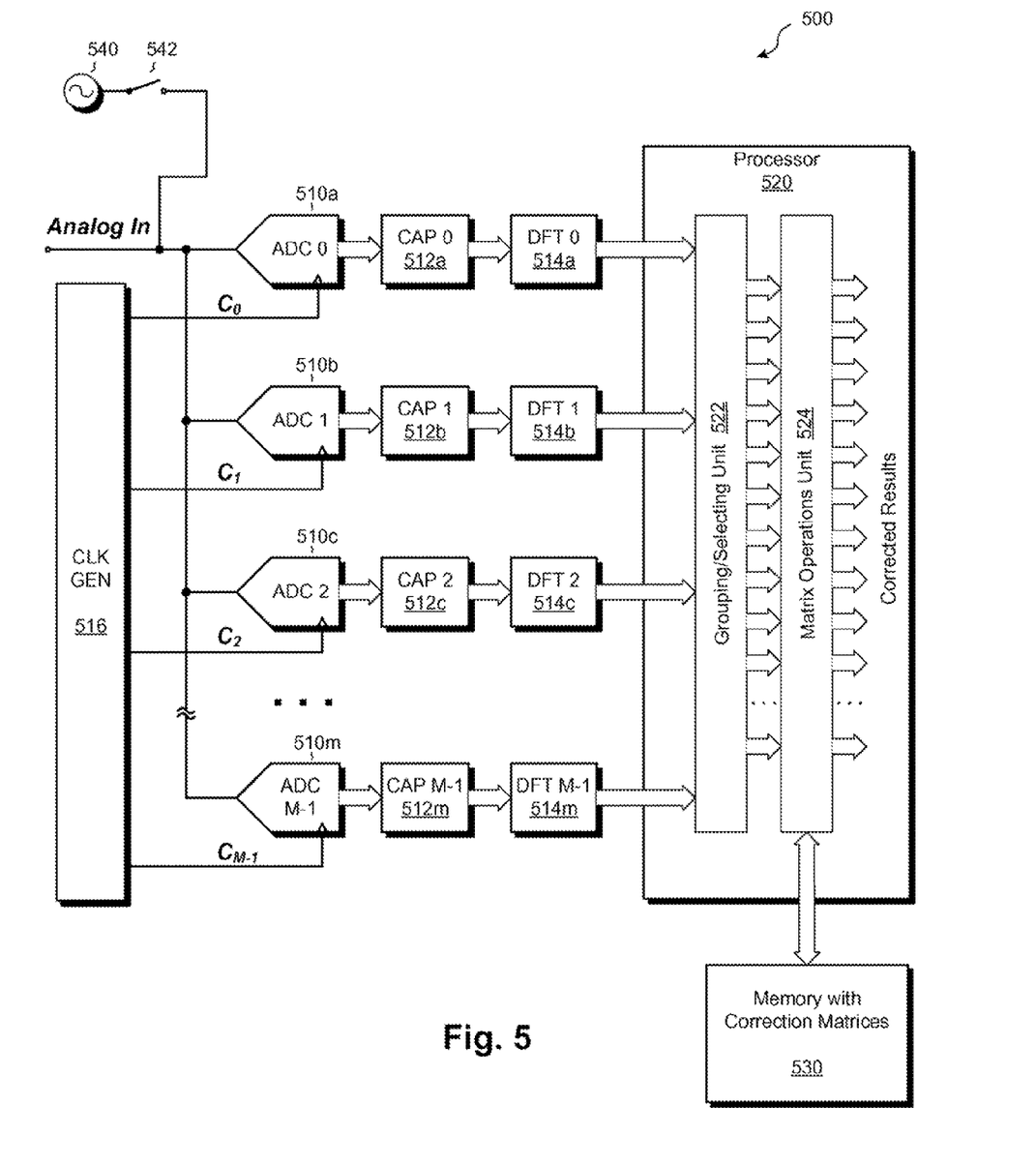
FIG. 5 is a simplified schematic of a PTIC according to an embodiment of the invention.

Steps 416 and 418 are repeated from each FMAF (generally N/2+1 times). It can therefore be seen that M(N/2+1) corrected DFT elements are created, enough to cover the Nyquist band of the reconstructed spectrum. FIG. 5 shows an example of a PTIC that can be used both for calibration and reconstruction. The PTIC 500 is constructed much the same way as the PTIC of FIG. 1. A total of M ADCs 510a-510m each have an analog input, a digital output, and a clock input. The inputs of the M ADCs are coupled together for receiving an input signal, Analog In. A clock generator 516 generates M different clocks, one for each of the ADCs. The M clocks each operate at $F_S$; however, the clocks are time-interleaved so that each has a different phase. The clocks are approximately uniformly distributed in time, so that the effective sampling rate of the PTIC is $MF_S$.

Unlike the PTIC of FIG. 1, the PTIC 500 includes M capture memories 512a-512m, one for each ADC. The capture memories 512a-512m each hold a series of samples acquired by the respective ADC. The PTIC 500 also includes M DFT units 514a-514m. One DFT unit is coupled to the output of each capture memory. Each DFT unit receives a stored series of samples from a respective ADC and is configured for generating a respective DFT. Preferably, each DFT unit operates on a series of N samples of Analog In acquired from a respective ADC at a sampling rate $F_S$.

The M DFT units 514a-514m are each coupled to a processor 520. The processor includes a grouping/selecting unit 522. The grouping/selecting unit is configured for grouping together DFT elements for use in spectrum reconstruction, and for selecting DFT elements for storage in a matrix during calibration. The grouping/selecting unit 522 is coupled to a matrix operations unit 524. The matrix operations unit is configured for performing matrix multiplication, for inverting matrices, and/or for storing DFT values in matrices. The processor 520 is coupled to a memory 530 of correction matrices. During calibration, the memory 530 stores matrix elements. During reconstruction, the memory 530 provides previously stored matrix elements for combination with DFT elements.

The PTIC 500 preferably also includes a signal source 540 and a switch 542. When the switch 542 is closed, the signal source 540 provides accurate calibration signals to the PTIC. These calibration signals include the frequencies used to create the correction matrices during calibration. When the switch 542 is opened, the PTIC 500 can receive input signals to be captured, without interference from the signal source 540.

The ADCs 510a-510m can be of any type that suits the target application. One important characteristic, however, is that the ADCs have sufficient input bandwidth to track Analog In, which is expected to include frequency content up to $MF_S/2$. If the ADCs lack sufficient bandwidth, they should preferably each be provided with an input sample-and-hold circuit that meets the bandwidth requirements. In this event, each sample-and-hold should be connected in series with the input of the respective ADC and receive the respective sampling clock. Each ADC should then be provided with a slightly delayed version of the respective sampling clock.

Figure 6:
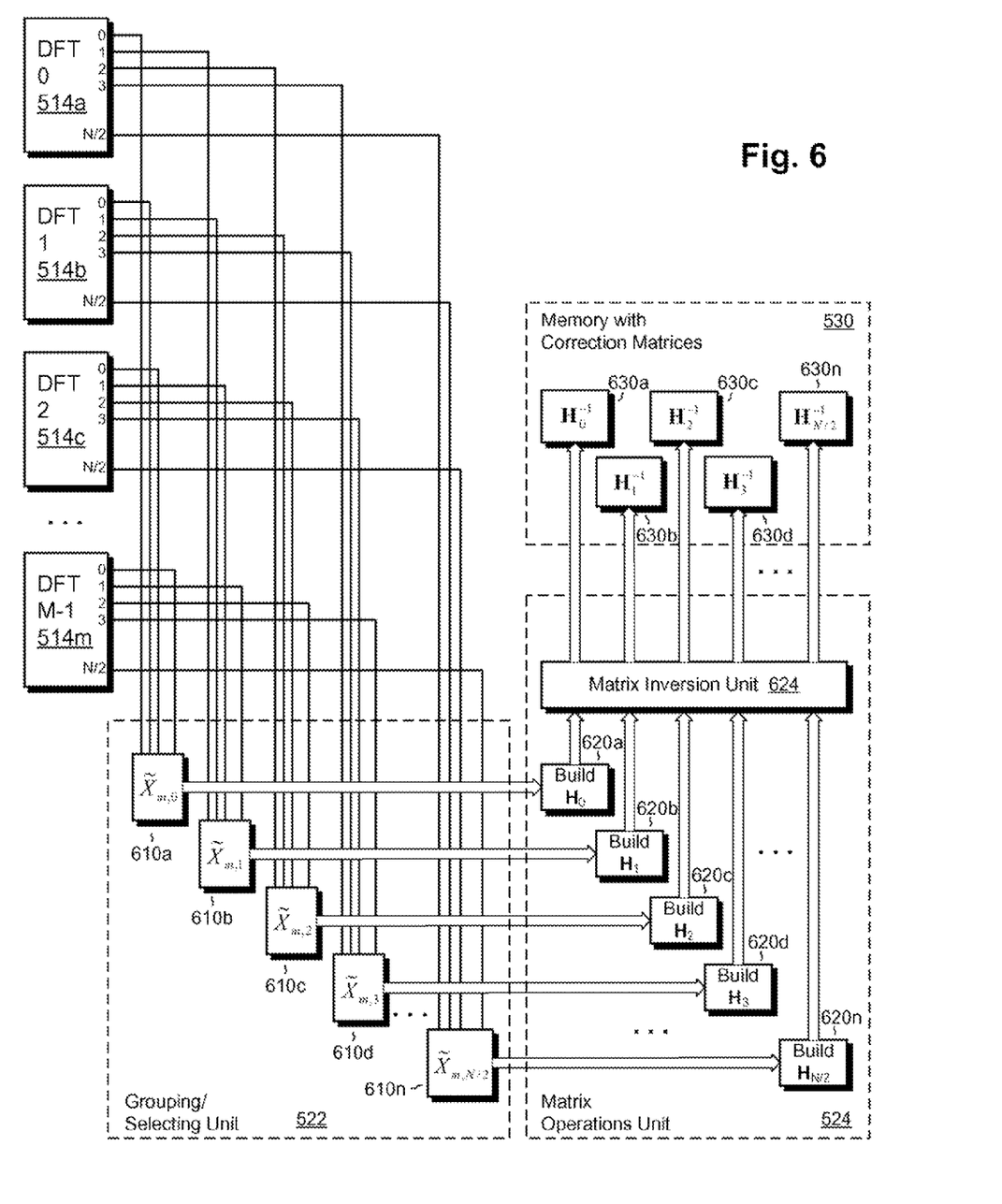
FIG. 6 is a more detailed schematic of portions of the PTIC of FIG. 5 that are involved in calculating and storing calibration information.

FIG. 6 shows certain elements of the PTIC 500, with the PTIC configured for acquiring calibration information. The arrangement of FIG. 6 can be used in connection with the calibration process shown in FIG. 3. As shown, the DFT units 514a-514m provide their outputs, respectively, to selection units 610a-610n. Bins of the DFT units are labeled (0 to N/2). Elements from corresponding bins of the DFT units are coupled to respective selection units 610a- 610n. For example, all DFT elements from bin 0 of the DFT units are coupled to selection unit 610a. In a similar manner, all DFT elements from bin 1 of the DFT units are coupled to selection unit 610b, and so forth.

The role of the selection units is to assist in constructing calibration matrices, $H_i$. During calibration and in response DFTs performed on sampled calibration signals, the selection units group together DFT elements according to bin number. Only one of the selection units is active at a time. The active selection unit is the one that groups together the bin number that corresponds to the FMAF currently being calibrated (FMAF$_i$). The grouped elements, each having the general form $\widetilde{X}_{m,i}$ are passed to matrix building units 620a-620n in the matrix operations unit 524. As different frequencies within each FMAF are measured, a new matrix $H_i$ is filled in. Upon measurement of all frequencies within a FMAF, the matrix $H_i$ is completed. A matrix inversion unit 624 inverts the matrix $H_i$, and the memory 530 stores the inverted matrix $H_i^{-1}$ for later retrieval. The circuitry of FIG. 6 is reused, for constructing as many matrices $H_i^{-1}$ as desired, preferably N of them.

Figure 7:
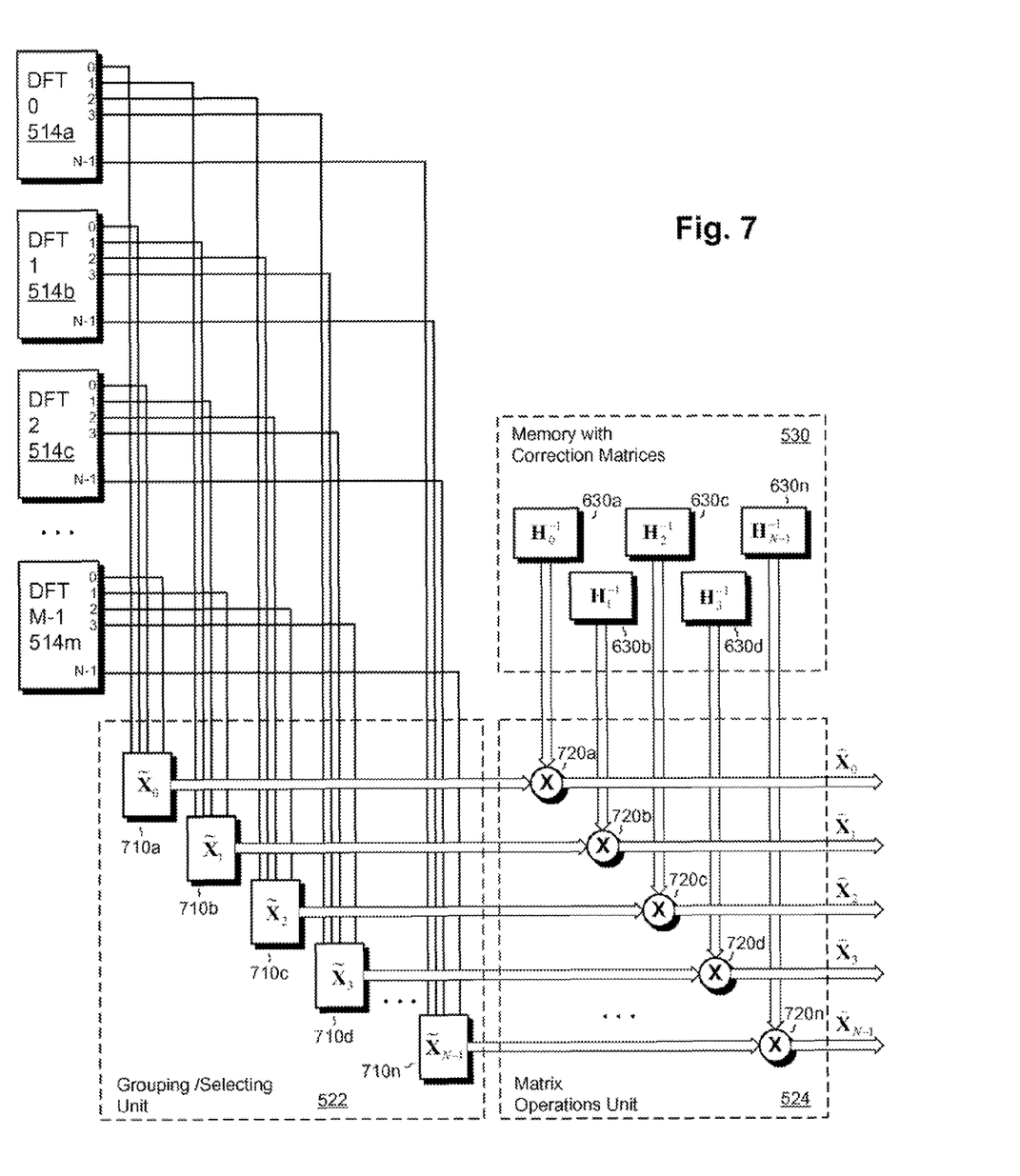
FIG. 7 is a more detailed schematic of portions of the PTIC of FIG. 5 that are involved in applying calibration information to sampled input signals.

FIG. 7 shows certain elements of the PTIC 500, with the PTIC configured for measuring and reconstructing the spectra of input signals. The arrangement of FIG. 7 can be used in connection with the reconstruction process shown in FIG. 4. As shown in FIG. 7, elements from corresponding bins of the DFT units are grouped together to by selection units 710a-710b. For example, selection unit 710a groups together DFT elements from bin 0 of all the DFT units, selection unit 710b groups together DFT elements from bin 1 of all the DFT units, and so forth. Selection units assemble the DFT elements into respective vectors, $\tilde{X}_i$. Preferably, there are a total of N selection units for assembling a total of N vectors.

Once assembled, the vectors are passed to the matrix operations unit 524, where they are multiplied by respective correction matrices, $H_i^{-1}$. Matrix multipliers 720a-720n perform the matrix multiplications, $X_i^{-1} \tilde{X}_i$, to produce respective corrected vectors, $\hat{X}_i$. Values from the corrected vectors are then arranged to form a corrected, reconstructed spectrum.

The model disclosed herein does not directly address offset errors. Offset errors can easily be removed using conventional techniques, i.e., by subtracted previously measured offset values from each ADC sample. We have recognized, however, that offset errors can also be corrected in the frequency domain. By grounding Analog In and directing the PTIC to measure a zeroed input, peaks appearing at DC (bin 0) of each DFT can be measured. The values of these peaks can then he subtracted from respective bin 0 readings acquired from input signals prior to reconstruction.

Performing offset correction in the frequency domain is much simpler than performing it in the time domain, as only M offset corrections need be made (one for each DFT) to reconstruct the spectrum of an input signal. By contrast, correcting offset errors in the time domain requires NM corrections. The techniques disclosed herein have particular applications to ATE. A not an uncommon practice in ATE systems to construct a PTIC from different source/capture instruments 114 having different physical locations within a tester. Oftentimes, instruments within ATE systems are equipped with their own digitizers and DSP engines, with the capability for DFTs to be performed locally. The techniques disclosed herein thus provide a way to make use of these local resources, which would otherwise go unutilized, in performing portions of signal reconstruction. For instance, in an ATE system with multiple digitizers each having its own DSP engine, the digitizers can capture an input signal and perform DFTs locally. Results of DFTs can be sent to a central processor for performing the remaining steps of reconstruction. Because reconstruction so accurately corrects for gain and phase errors, differences between instruments in terms of both gain and timing can be largely if not completely eliminated. Thus, a new and beneficial use can be made of existing instruments.

Figure 8:
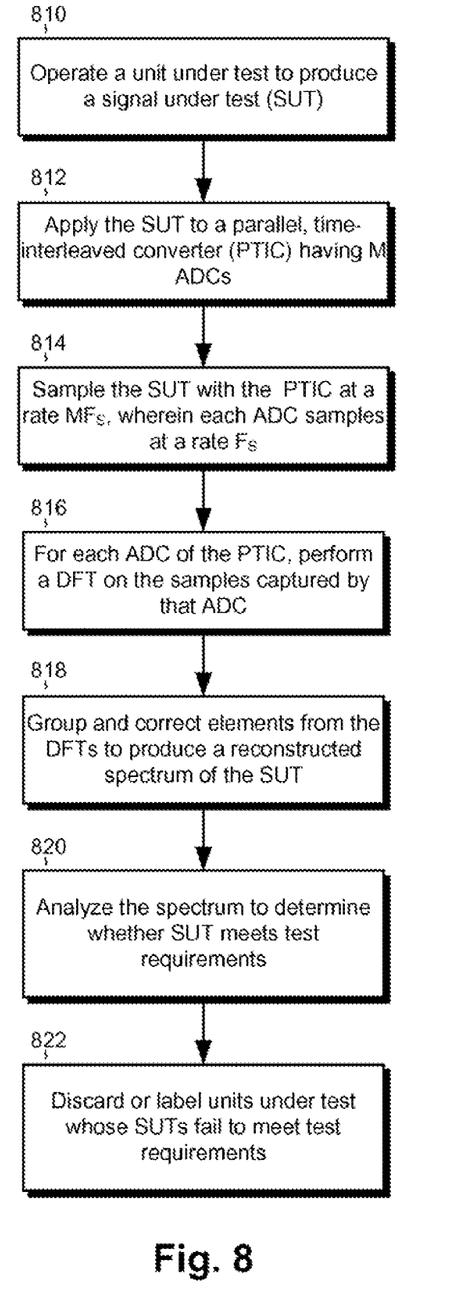
FIG. 8 is a flowchart showing a process for applying a correction technique according to an embodiment of the invention in a testing application.

FIG. 10 shows a process for testing a signal in an ATE system, using the principles disclosed herein. At step 810, a UUT (unit under test) is connected to the tester and stimulated to produce a SUT (signal under test). The UUT can be any assembly or device, such as an integrated circuit. The UUT is generally stimulated by supplying it with power, ground, and one or more stimulus signals. In response, the UUT produces the SUT.

At step 812, the SUT is applied to a PTIC circuit. The PTIC circuit can be in the form of a single instrument, or it can be constructed out of different instruments as described above. Alternatively, it can be a circuit built onto a test fixture.

At step 814, the PTIC is made to sample the SUT, and, at step 816, a DFT is performed on each series of samples. Elements from the DFTs are then grouped and corrected (step 818) to produce a reconstructed spectrum of the SUT.

At step 820, the reconstructed spectrum is analyzed to determine whether it meets test requirements. Typically, the ATE runs a test program. The test program analyzes the reconstructed spectrum. Depending on the test performed, the test program may measure spurious content, signal-to-noise ratio, or spurious free dynamic range of the reconstructed spectrum.

At step 822, action is taken on the OUT depending upon the test results. If the UUT passes the test, i.e., if test requirements are met, the UUT is generally identified as passing. If the test is done in a manufacturing environment, the UUT may be packaged, labeled, and prepared for shipment. If the UUT fails the test, it may be discarded. If the failure is not catastrophic and merely reflects that the device failed to meet the best possible quality standards, the UUT may be graded according to its tested performance, and labeled accordingly.

The techniques disclosed herein are not limited to ATE. Rather, they can be used advantageously in many applications, including those requiring signal transmission and reception.

Figure 9:
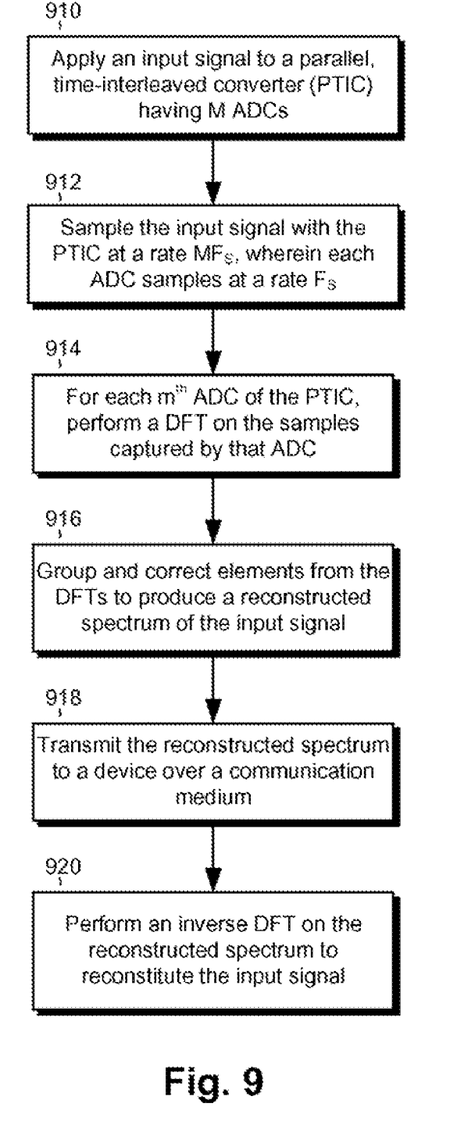
FIG. 9 is a flowchart showing a process for applying a correction technique according to an embodiment of the invention in an application for transmitting and receiving signals.

FIG. 9 shows a process for transmitting and receiving a signal. At step 910, an input signal to be transmitted is applied to a PTIC circuit. The input signal is sampled by each of the M ADCs of the PTIC (step 912), and a DFT is performed on each resulting series of samples (step 914).

At step 916, elements from the DFTs are grouped and corrected to produce a reconstructed spectrum, of the input signal. At step 918, the reconstructed spectrum is transmitted through a communication medium to a receiving device. At step 920, an inverse DFT is performed on the received, reconstructed spectrum, to yield a digital, discrete-time version of the input signal, which can then be reconstituted using a digital-to-analog converter. Alternatively, digital values acquired by the PTIC at any step of reconstruction can be transmitted. Correction and reconstruction of the input signal can thus be performed on either the transmission side or reception side.

The process of FIG. 9 can be used beneficially in any transmission/reception context where real time transmission is not required. Given the large volume of computation required for signal reconstruction, the process is generally not well suited for real time applications. It is a good match for applications such as OFDM (orthogonal frequency-division multiplexing), however, where real time transmission is not required.

lit the preferred embodiment, the PTIC 500 is implemented as a source/capture instrument 114 of an ATE system. The clock generator 516 generates clocks for the M ADCs locally, in response to a master clock signal from the clock distribution circuit 112. The signal source 540 is preferably a highly stable, programmable, continuous wave source. DFT units 514a-514m are preferably implemented with separate DSP engines. The processor 520 is preferably a general purpose processor that accesses the DFT units via a data bus. The memory 530 is preferably a non-volatile memory.

The grouping/sorting unit 522 and the matrix operations unit 524 are preferably implemented with software that runs on the general purpose processor. The processor running the software thus assumes the physical configurations shown in FIGS. 6 and 7.

Having described one embodiment, numerous alternative embodiments or variations can be made. For instance, although the elements of the PTIC have been described as residing on a single instrument, this is not required. Alternatively, different elements of the PTIC can be distributed among different instruments or parts of a system. In addition, there is no need for the PTIC to be part of an ATE system. It can alternatively be a stand-alone device, or part of a system for a different application.

The capture memories 512a-512m are shown and described as separate. However, they may alternatively be combined into one or more memory devices. Similarly, the DFT Units 514a-514m need not be separate. Alternatively, they can be implemented with one or more DSP engines, or with one or more processors of a different type. According to one variant, the functions of the DFT units are performed by the processor 520. The processor 520 connects to the capture memories (or memory) via a data bus or other communication medium, and software runs on the processor to perform the DFTs.

According to yet another variant, software that runs encodable instructions for carrying out the various processes is replaced with firmware or hardware. The memory 530 need not be a semiconductor memory. It can alternatively be a magnetic memory, such as a magnetic disk or tape. It can also be an optical memory, such as a compact disk or DVD, or any other device for holding data.

As shown and described, the PTIC acquires calibration factors by performing DFTs on sampled calibration signals. Full DFTs are not required, however. Indeed a more efficient approach is to calculate only a single DFT element for each ADC, at the bin where a reading is expected. Calibration can thus be conducted much faster than if DFT elements are computed for all bins.

Although calibration and reconstruction have been described as covering a full spectrum from DC to $MF_S/2$, this is not required. Alternatively, calibration and/or reconstruction can be limited to one or more parts of a full spectrum, as the target application requires. In addition, calibration need not cover all frequencies of the reconstructed spectrum, even when reconstruction is complete. Certain frequencies can be skipped, and calibration factors for the skipped frequencies can be estimated.

As shown and described, reconstructed spectral components are calculated by solving systems of equations. Those equations are preferably solved with matrix algebra. However, this is merely an example. Other ways of solving systems of equations are known, and the invention is not limited to use with matrices.

Those skilled in the art will therefore understand that various changes in form and detail may be made to the embodiments disclosed herein without departing from the scope of the invention.

What is claimed is:

1. A method of testing signals with a PTIC (parallel, time-interleaved converter) that includes M ADCs (analog-to-digital converters) each clocked at a rate $F_S$ and time-interleaved to provide an overall sampling rate of $MF_S$, the method comprising:
    (A) stimulating a UUT (unit under test) to produce an SUT (signal under test) having at least one test requirement:
    (B) applying the SUT to a PTIC:
    (C) acquiring a series of samoles of the SUT by each of the M ADCs of the PTIC;
    (D) performing a DFT (Discrete Fourier Transform) on each series of samples to yield M DFTs;
    (E) processing the M DFTs to yield a reconstructed spectrum covering a freguency range areater than $F_S$;
    (F) analyzing the reconstructed spectrum to determine whether the UUT meets the at least one test requirement; and
    (G) discarding or grading the UUT responsive to the determination of Step F, wherein the M DFTs each have DFT elements arranged by bin number, and the step E of processing further comprises:
    (E1) sorting the DFT elements from the M DFTs into groups according to bin number, wherein each group includes all DFT elements across the plurality of DFTs associated with the same bin number;
    (E2) accessing a plurality of collections of correction factors; and
    (E3) algebraically combining each group with a respective collection of correction factors.

2. A method as recited in claim 1, wherein the step of analyzing the reconstructed spectrum comprises determining whether its spurious content is below a specified limit.

3. A method as recited in claim 2, wherein the step E1 of sorting comprises arranging DFT elements into a plurality of vectors of M DFT elements each.

4. A method as recited in claim 3, wherein each of the plurality of collections of correction factors is arranged as an M×M matrix of correction factors, wherein one dimension of the matrix corresponds to ADC (1-M) and the other dimension of the matrix corresponds to frequency.

5. A method as recited in claim 4, further comprising computing each matrix by inverting a matrix H of DFT values acquired during a calibration of the PTIC.

6. A method as recited in claim 5, further comprising constructing a plurality of H matrices, wherein each H matrix is constructed according to the steps of:
    (AA) identifying a frequency $F_C$ associated with a bin number of the plurality of DFTs;
    (BB) applying a signal of frequency $F_C$ to the PTIC;
    (CC) acquiring a series of samples of $F_C$ by each of the M ADCs, to produce M series of samples;
    (DD) for each of the M series of samples, calculating a DFT element for the DFT bin associated with the frequency $F_C$;
    (EE) storing each calculated DFT element in the respective H matrix; and
    (FF) repeating steps AA-EE for each of a plurality of frequencies between DC and $MF_S/2$ that alias to $F_C$ sampled at a rate $F_S$.

7. A method as recited in claim 6, wherein different H matrices are constructed for different bin numbers of the plurality of DFTs.

8. A method as recited in claim 1, wherein the step (E) of processing the M DFTs yields a reconstructed spectrum covering a frequency range of $MF_S/2$.

9. A method as recited in claim 1, wherein the step (E) of processing includes correcting for gain errors.

10. A method as recited in claim 1, wherein the step (E) of processing includes correcting for phase and/or timing errors.

11. A. method as recited in claim 1, wherein the step (E) of processing includes correcting for offset errors.

12. A method of transmitting and receiving a signal, comprising:
    (A) applying a signal to a PTIC (parallel, time-interleaved converter) that includes M ADCs (analog-to-digital converters) each clocked at a rate $F_S$ and time-interleaved to provide an overall sampling rate of $MF_S$;
    (B) acquiring a series of samples of the signal by each of the M ADCs of the PTIC;
    (C) performing a DFT (Discrete Fourier Transform) on each series of samples to yield M DFTs;
    (D) processing the M DFTs to yield a reconstructed spectrum covering a frequency range greater than $F_S$;

(E) transmitting the reconstructed spectrum to a receiving circuit; and
(F) performing and inverse DFT on the received, reconstructed spectrum to reconstruct the signal.

13. A method as recited in claim 12, wherein the step (D) of processing includes correcting a plurality of frequency-dependent timing errors from each of the M ADCs.

14. A circuit for analyzing a signal, comprising:
an input;
a clock generator for generating M clocks each operable at a rate $F_S$ and each having a different phase;
M ADCs, each having an analog input coupled to the input, a digital output, and a clock input coupled to the clock generator for receiving a respective one of the M clocks;
M DFT units, each DFT unit respectively coupled to the digital output of one of the M ADCs and constructed and arranged for producing DFT elements; and
a processor, coupled to the M DFT units, the processor having encoded instructions for processing the DFT elements from the M DFT units to produce a reconstructed spectrum covering a frequency range greater than $F_S$ and for correcting a plurality of frequency-dependent gain errors from each of the M ADCs.

15. A circuit as recited in claim 14, wherein the M DFT units and the processor are functional units incorporated within a data processing system.

16. A circuit as recited in claim 15, wherein the data processing system is a digital signal processing system.

17. A circuit as recited in claim 14, wherein the M DFT units are each arranged for producing DFT elements in a plurality of bins arranged by bin number, and wherein the circuit further comprises a memory that stores a plurality of sets of calibration factors, wherein each set of calibration factors corresponds to a different bin number.

18. A circuit as recited in claim 14, wherein the encoded instructions processor are further for correcting a plurality of frequency-dependent timing errors from each of the M ADCs.

19. A circuit as recited in claim 14, wherein different ones of the M ADCs are located on different instruments of an ATE system.

20. A circuit as recited in claim 19, wherein different ones of the M DFT units are located on different instruments of the ATE system.

21. A circuit for analyzing a signal, comprising:
an input;
a clock generator for generating a plurality of clocks each operable at a rate $F_S$ and each having a different phase;
a plurality of ADCs, each having an analog input coupled to the input, a digital output, and a clock input coupled to the clock generator for receiving a respective one of the plurality of
a plurality of DFT means, each coupled to one of the plurality of ADCs, for calculating a plurality of DFTs of samples acquired from each of the plurality of ADCs; and
processing means, coupled to the plurality of DFT means, for processing the DFT elements to construct a reconstructed spectrum covering a frequency range greater than $F_S$.
wherein each of the plurality of DFT means is constructed and arranged for producing DFT elements in a plurality of bins arranged by bin number, and the processing means includes:
memory means for storing a plurality of calibration factors arranged by bin number;
means for sorting DFT elements into groups according to bin number, wherein each group includes all DFT elements across the plurality of DFT means associated with the same bin number; and
means for algebraically combining the groups of DFT elements for each bin number with a set of calibration factors for the corresponding bin numbers, for generating corrected DFT elements representative of the input signal.

22. A circuit as recited in claim 21, wherein at least some of the plurality of ADCs are located on different instruments of an ATE system.

23. A circuit for analyzing a signal, comprising:
an input;
a clock generator for generating a plurality of clocks;
a plurality of ADCs, each having an analog input coupled to the input, a clock input coupled to the clock generator for receiving a respective one of the plurality of clocks, and a digital output for providing a digital output signal;
a processor for executing encoded instructions, including instructions for performing a plurality of DFTs on the digital output signal of each of the plurality of ADCs, and including encoded instructions for processing and combining the plurality of DFTs to produce a reconstructed spectrum DFT.

24. A circuit as recited in claim 23, wherein at least some of the plurality of ADCs are located on different instruments of an automatic test system.

25. A circuit for analyzing a signal, comprising:
an input;
a clock generator for generating M clocks each operable at a rate $F_S$ and each having a different phase;
M ADCs, each having an analog input coupled to the input, a digital output, and a clock input coupled to the clock generator for receiving a respective one of the M clocks;
M DFT units, each OFT unit respectively coupled to the digital output of one of the M ADCs and constructed and arranged for producing DFT elements; and
a processor, coupled to the M DFT units, the processor having encoded instructions for processing the DFT elements from the M DFT units to produce a reconstructed spectrum covering a frequency range greater than $F_S$,
wherein the M DFT units are each arranged for producing DFT elements in a plurality of bins arranged by bin number, and wherein the circuit further comprises a memory that stores a plurality of sets of calibration factors, wherein each set of calibration factors corresponds to a different bin number, and wherein the processor includes encoded instructions for sorting DFT elements from the M DFT units into groups according to bin number, and encoded instructions for algebraically combining the group for each bin number with the set of calibration factors for the corresponding bin number, for generating corrected DFT elements representative of the input signal.

26. A method of analyzing a signal, comprising:
(A) applying a signal to a PTIC (parallel, time-interleaved converter) that includes M ADCs (analog-to-digital converters) each clocked at a rate $F_S$ and time-interleaved to provide an overall sampling rate of $MF_S$;
(B) acquiring a series of samples of the signal by each of the M ADCs of the PTIC;
(C) performing a DFT (Discrete Fourier Transform) on each series of samples to yield M DFTs; and
(D) processing the M DFTs to yield a reconstructed spectrum covering a frequency range greater than $F_S$, wherein said processing includes correcting a plurality of frequency-dependent gain errors and a plurality of frequency-dependent phase errors from each of the M ADCs.

27. A method as recited in claim 26, wherein the M DFTs each have DFT elements arranged by bin number, and the step D of processing further comprises:
(D1) sorting the DFT elements from the M DFTs into groups according to bin number, wherein each group includes all DFT elements across the plurality of DFTs associated with the same bin number;
(D2) accessing a plurality of collections of correction factors; and
(D3) algebraically combining each group with a respective collection of correction factors.

28. A method as recited in claim 27, wherein the step D1 of sorting comprises arranging DFT elements into a plurality of vectors of M DFT elements each.

29. A method as recited in claim 28, wherein each of the plurality of collections of correction factors is arranged as an M–M matrix of correction factors, wherein one dimension of the matrix corresponds to ADC (1-M) and the other dimension of the matrix corresponds to frequency.

30. A method as recited in claim 29, further comprising computing each matrix by inverting a matrix H of DFT values acquired during a calibration of the PTIC.

31. A method as recited in claim 30, further comprising constructing a plurality of H matrices, wherein each H matrix is constructed according to the steps of:
(AA) identifying a frequency $F_C$ associated with a bin number of the plurality of DETs;
(BB) applying a signal of frequency $F_C$ to the PTIC;
(CC) acquiring a series of samples of $F_C$ by each of the M ADCs, to produce M series of samples;
(DD) for each of the M series of samples, calculating a DFT element for the DFT bin associated with the frequency $F_C$;
(EE) storing each calculated DFT element in the respective H matrix; and
(FF) repeating steps AA-EE for each of a plurality of frequencies between DC and $MF_S/2$ that alias to $F_C$ when sampled at a rate $F_S$.

32. A method as recited in claim 31, wherein different H matrices are constructed for different bin numbers of the plurality of DFTs.

* * * * *